US010475496B1

(12) United States Patent
Annunziata et al.

(10) Patent No.: US 10,475,496 B1
(45) Date of Patent: Nov. 12, 2019

(54) REDUCED SHORTS IN MAGNETIC TUNNEL JUNCTIONS

(71) Applicant: INTERNATIONAL BUSINESS MACHINES CORPORATION, Armonk, NY (US)

(72) Inventors: Anthony Annunziata, Stamford, CT (US); Bruce B. Doris, Slingerlands, NY (US); Eugene J. O'Sullivan, Nyack, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/971,331

(22) Filed: May 4, 2018

(51) Int. Cl.
*H01L 27/00* (2006.01)
*G11C 11/02* (2006.01)
*G11C 11/16* (2006.01)
*H01L 43/02* (2006.01)
*H01L 43/12* (2006.01)
*H01L 27/22* (2006.01)
*H01L 43/10* (2006.01)
*B82Y 25/00* (2011.01)

(52) U.S. Cl.
CPC .......... *G11C 11/161* (2013.01); *H01L 27/226* (2013.01); *H01L 43/02* (2013.01); *H01L 43/10* (2013.01); *H01L 43/12* (2013.01); *B82Y 25/00* (2013.01)

(58) Field of Classification Search
CPC ......... H01L 43/02; H01L 43/10; H01L 43/12; H01L 27/226; H01L 27/222; H01L 27/2481; G11C 11/161; G11C 11/16; G11C 11/15; G11C 11/1659; B82Y 25/00; B82Y 40/00
See application file for complete search history.

(56) References Cited

U.S. PATENT DOCUMENTS

| | | | |
|---|---|---|---|
| 6,358,756 B1 | 3/2002 | Sandhu et al. |
| 7,241,632 B2 | 7/2007 | Yang |
| 7,645,618 B2 | 1/2010 | Ditizio |
| 8,273,582 B2 | 9/2012 | Nozieres et al. |
| 8,574,928 B2 | 11/2013 | Satoh et al. |
| 8,883,520 B2 | 11/2014 | Satoh et al. |
| 9,450,180 B1 | 9/2016 | Annunziata et al. |
| 9,705,071 B2 | 7/2017 | Annunziata et al. |
| 9,735,347 B2 * | 8/2017 | Yamakawa |

(Continued)

OTHER PUBLICATIONS

Anders Persson et al., "Etch-stop technique for patterning of tunnel junctions for a magnetic field sensor," Journal of Micromechanics and Microengineering, vol. 21, No. 4, 2011, 045014, 8 pages.

(Continued)

*Primary Examiner* — Nikolay K Yushin
(74) *Attorney, Agent, or Firm* — Cantor Colburn LLP; Vazken Alexanian

(57) ABSTRACT

A technique relates to a magnetic device. A stack is formed including a magnetic tunnel junction (MTJ), the MTJ including a reference magnetic layer and a free magnetic layer sandwiching a tunnel barrier layer. A protective film is formed on a bottom portion of the MTJ such that an upper portion of the MTJ is exposed. A cleaning is performed on the upper portion of the MTJ that is exposed such that any residual material is removed.

25 Claims, 11 Drawing Sheets

(56) References Cited

U.S. PATENT DOCUMENTS

| | | |
|---|---|---|
| 2013/0267042 A1 | 10/2013 | Satoh et al. |
| 2015/0372225 A1 | 12/2015 | Gaidis et al. |
| 2017/0062705 A1* | 3/2017 | Yamakawa |
| 2017/0125668 A1 | 5/2017 | Paranjpe et al. |

OTHER PUBLICATIONS

Shigeki Takahashi et al., "Ion-beam-etched profile control of MTJ cells for improving the switching characteristics of high-density MRAM," IEEE Transactions on Magnetics, vol. 42, No. 10, 2006, pp. 2745-2747.

* cited by examiner

FORM A STACK INCLUDING A MAGNETIC TUNNEL JUNCTION (MTJ), THE MTJ INCLUDING A REFERENCE MAGNETIC LAYER AND A FREE MAGNETIC LAYER SANDWICHING A TUNNEL BARRIER LAYER 1002

FORM A PROTECTIVE FILM ON A BOTTOM PORTION OF THE MTJ SUCH THAT AN UPPER PORTION OF THE MTJ IS EXPOSED 1004

CLEAN THE UPPER PORTION OF THE MTJ THAT IS EXPOSED SUCH THAT ANY RESIDUAL MATERIAL IS REMOVED 1006

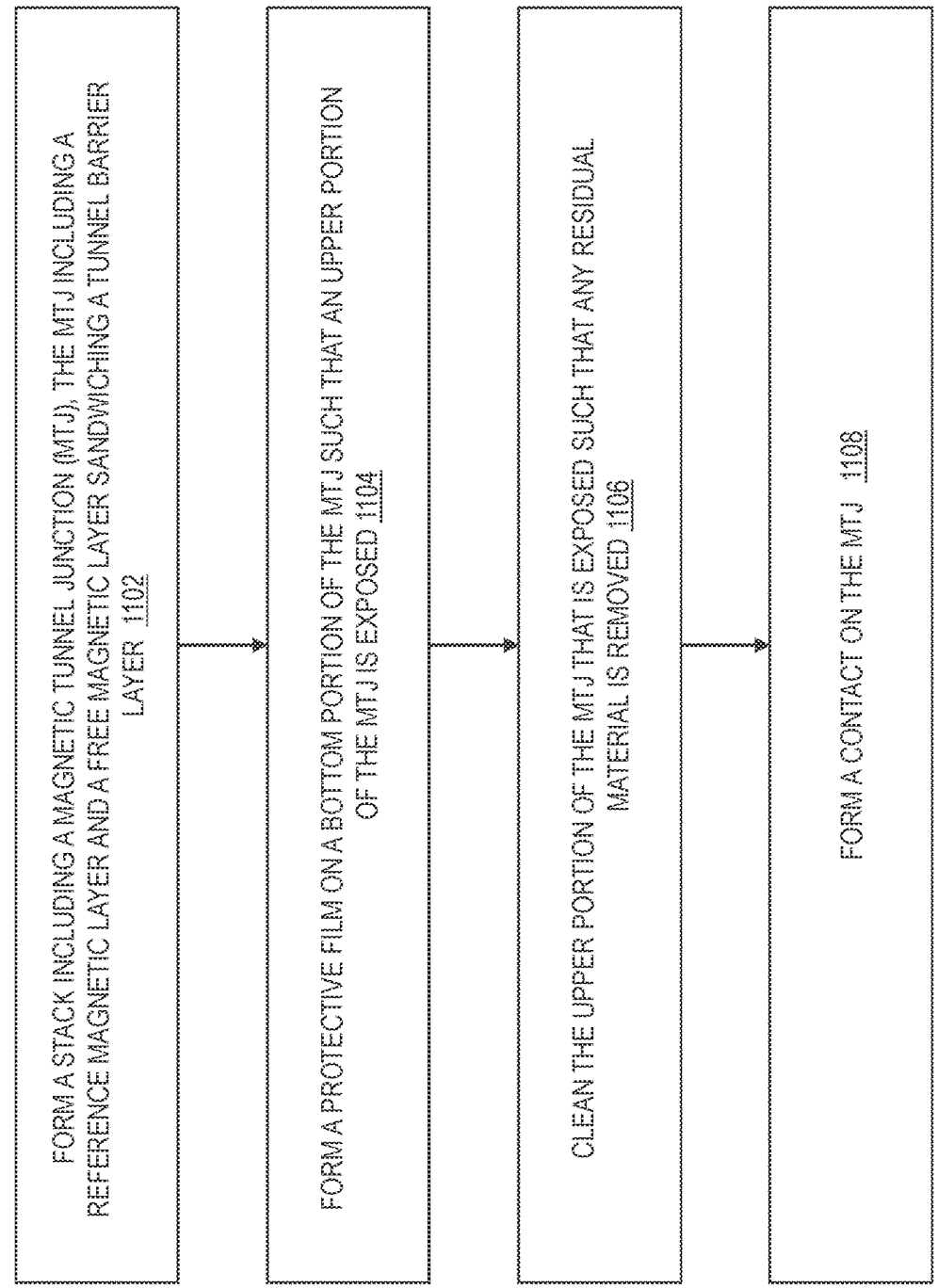

REDUCED SHORTS IN MAGNETIC TUNNEL JUNCTIONS

BACKGROUND

The present invention generally relates to fabrication methods and resulting structures for semiconductor/magnetic devices, and more specifically, to reducing shorts in magnetic tunnel junctions (MTJs).

Magnetoresistive random access memory (MRAM) is a non-volatile memory that combines a magnetic device with standard silicon-based microelectronics to achieve the combined attributes of non-volatility, high-speed read/write operations, high read/write endurance, and data retention. The term "magnetoresistance" describes the effect whereby a change to certain magnetic states of the MTJ storage element (or "bit") results in a change to the MTJ resistance, hence the name "Magnetoresistive" RAM. Data is stored in MRAM as magnetic states or characteristics (e.g., magnetization direction, magnetic polarity, magnetic moment, etc.) instead of electric charges. In a typical configuration, each MRAM cell includes a transistor, a magnetic tunnel junction (MTJ) device for data storage, a bit line, and a word line. In general, the MTJ's electrical resistance will be high or low based on the relative magnetic states of certain MTJ layers. Data is written to the MTJ by applying certain magnetic fields or charge currents to switch the magnetic states of certain MTJ layers. Data is read by detecting the resistance of the MTJ. Using a magnetic state/characteristic for storage has two main benefits. First, unlike electric charge, magnetic state does not leak away with time, so the stored data remains even when system power is turned off. Second, switching magnetic states has no known wear-out mechanism.

Spin-transfer torque (STT) is a phenomenon that can be leveraged in MTJ-based storage elements to assist in switching the storage element from one storage state (e.g., "0" or "1") to another storage state (e.g., "1" or "0"). For example, STT-MRAM uses electrons that have been spin-polarized to switch the magnetic state (i.e., the magnetization direction) of a free layer of MTJ. The MTJ is configured to include a reference/fixed magnetic layer, a thin dielectric tunnel barrier, and a free magnetic layer. The MTJ has a low resistance when the magnetization direction of its free layer is parallel to the magnetization direction of its fixed layer. Conversely, the MTJ has a high resistance when its free layer has a magnetization direction that is oriented anti-parallel to the magnetization direction of its fixed layer.

SUMMARY

Embodiments of the invention are directed to a method for cleaning a magnetic device. A non-limiting example of the method includes forming a stack including a magnetic tunnel junction (MTJ), the MTJ including a reference magnetic layer and a free magnetic layer sandwiching a tunnel barrier layer. Also, the method includes forming a protective film on a bottom portion of the MTJ such that an upper portion of the MTJ is exposed and cleaning the upper portion of the MTJ that is exposed such that any residual material is removed.

Embodiments of the invention are directed to a method for fabricating a magnetic device. A non-limiting example of the method includes forming a stack including a magnetic tunnel junction (MTJ), the MTJ including a reference magnetic layer and a free magnetic layer sandwiching a tunnel barrier layer. Also, the method includes forming a protective film on a bottom portion of the MTJ such that an upper portion of the MTJ is exposed and cleaning the upper portion of the MTJ that is exposed such that any residual material is removed. The method includes forming a contact on the MTJ.

Embodiments of the invention are directed to a magnetic device. A non-limiting example of the magnetic device includes a stack including a magnetic tunnel junction (MTJ), the MTJ including a reference magnetic layer and a free magnetic layer sandwiching a tunnel barrier layer. The magnetic device includes a protective film formed on a bottom portion of the MTJ such that an upper portion of the MTJ is exposed and another protective film formed on the upper portion of the MTJ.

Embodiments of the invention are directed to a method for cleaning a magnetic device. A non-limiting example of the method includes forming a magnetic tunnel junction (MTJ) and forming a protective film on a portion of the MTJ such that another portion of the MTJ is exposed. The method includes cleaning the other portion of the MTJ that is exposed.

Embodiments of the invention are directed to a magnetic device. A non-limiting example of the magnetic device includes a magnetic tunnel junction (MTJ) and a protective film formed on a portion of the MTJ such that another portion of the MTJ is exposed. One or more parts of the portion of the MTJ has redeposited material while the other portion is free of the redeposited material.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 11 depicts a flowchart of a method of forming a magnetic device according to embodiments of the invention.

Figure 1:
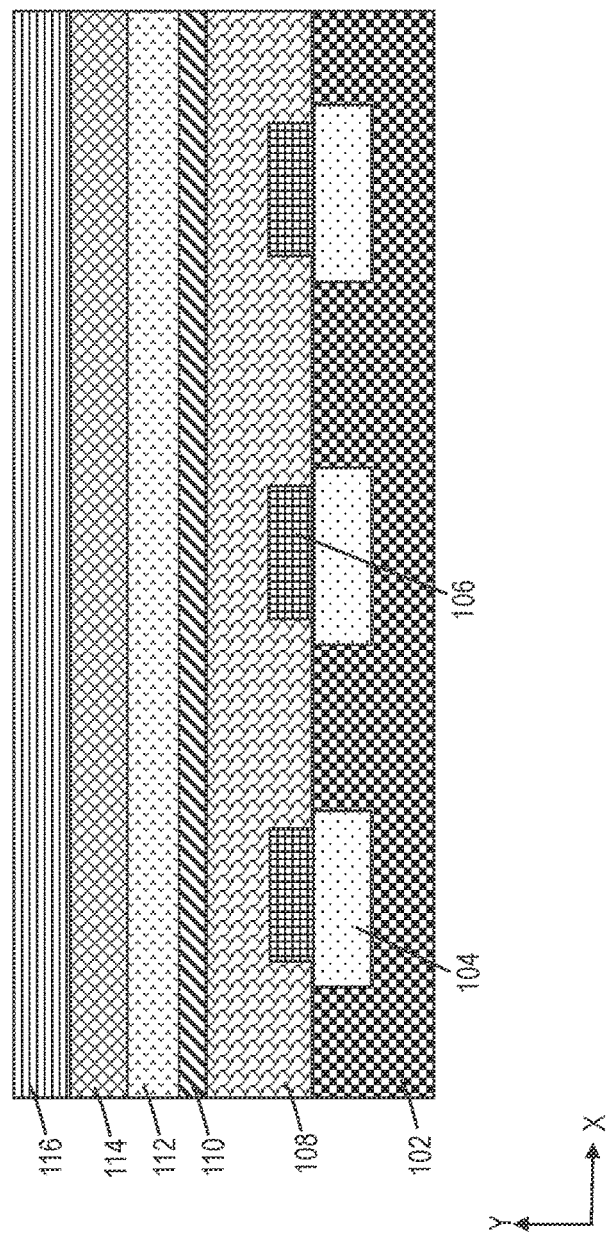
FIG. 1 depicts a cross-sectional view of a magnetic device after initial fabrication operations according to embodiments of the invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, spin-transfer torque magnetoresistive random access memory (STT-MRAM) devices offer many benefits over semiconductor based memories such as dynamic random-access memory (DRAM) and static random-access memory (SRAM). In order to compete with DRAM and SRAM, however, the STT-MRAM devices are integrated into the wiring layers of standard silicon logic and memory chips. One of the difficult aspects of this integration is subtractive etching of the magnetic stack from a blanket film, in which the subtractive etching is necessary to define the STT-MRAM device. Typically, specialized reactive ion etches (RIE) and inert ion beam etches (IBE) are used in the state-of-the-art. However, all known RIE processes for etching MRAM cause significant device degradation because these are small devices used for technological applications. IBE processes do not typically result in as much magnetic damage, so they are generally preferred, but metal redeposition from even advanced IBE processes typically causes shorts across the tunnel barrier in the STT-MRAM stack, which is a yield detractor. This metal redeposition can often be removed by oxidizing the redeposited metal to make it insulating, but this oxidation step itself can cause device degradation.

Turning now to an overview of the aspects of the invention, one or more embodiments of the invention address the above-described shortcomings of the prior art by providing fabrication methods configured and arranged to substantially reduce or eliminate shorting caused by redeposition of metal from the substrate in an etched MRAM device (e.g., an ion beam etched MRAM device), and also reduce process degradation from other known solutions to this problem. Particularly, an initial IBE of the device is performed to pattern the MRAM device, and then a protective film (e.g., SiN) is deposited to encapsulate the device. Next, a planarizing film is deposited and planarized to the top of the protective film on the MRAM device. A dry or wet etch is then used to recess the planarizing film to the desired height. An aspect of the invention is recessing the planarizing film so that it protects the pedestal (stacked layers) as well as a portion of the MTJ stack under the tunnel barrier. Subsequently, the tunnel barrier is cleaned using an IBE with one or more angles and ion species.

Turning now to a more detailed description of aspects of the present invention, FIG. 1 depicts a cross-sectional view of a magnetic device 100 according to embodiments of the invention. Wires 104 are formed in a substrate 102. The substrate 102 can be patterned and the wires 104 can be deposited in the patterned substrate 102. The substrate 102 can be an insulating material. The wires 104 are formed of conductive material, and the conductive material can include copper, gold, aluminum, etc.

Bottom electrodes 106, which also referred to as contact electrodes, are individually formed on top of individual wires 104. The material of the bottom electrodes 106 can be deposited and etched into the shape for the bottom electrodes 106. Example materials of the bottom electrodes 106 (including the top electrode 116) can include, for example, tantalum, tantalum nitride, titanium, or any combination thereof. The conductive materials of wires 104 and bottom electrodes 106 (including the top electrode 116) can be deposited by, for example, physical vapor deposition (PVD), ion beam deposition (IBD), atomic layer deposition (ALD), electroplating, or other like processes.

Material of a reference layer 108 is formed on top of the substrate 102, on top of portions of the individual copper wires 104, and on top of the bottom electrodes 106. Material of a tunnel barrier 110 is formed on top of the reference layer 108. Material of a free layer 112 is deposited on top of the tunnel barrier 110. The tunnel barrier 110 can be formed using a standard deposition process, for example, sputtering, oxidation, PVD, IBD, ALD, and other like processes. The tunnel barrier layer 110 includes a non-magnetic, insulating material. An example of an insulating material for the tunnel barrier layer 110 is magnesium oxide (MgO). The tunnel barrier layer 110 can include other dielectric materials. The thickness of the tunnel barrier layer 110 can range from about 1 nm to 3 nm. The thickness of the tunnel barrier layer 110 is not intended to be limited and can generally vary.

The reference layer 108 and the free layer 112 include conductive, magnetic materials, for example, metals or metal alloys. The reference layer 108 and the free layer 112 can be formed by employing a deposition process, for example, PVD, IBD, ALD, electroplating, or other like processes.

The reference layer 108 and the free layer 112 can include one layer or multiple layers. The reference layer 108 and the free layer 112 can include the same materials and/or layers or different materials and/or layers. Examples of materials for the reference layer 108 and/or the free layer 112 include iron, cobalt, boron, aluminum, nickel, silicon, oxygen, carbon, zinc, beryllium, vanadium, boron, magnesium, or any combination thereof. The reference layer 108 and free layer 112 are magnetic layers which usually include ferromagnetic materials.

The reference layer 108 has a thickness that can generally vary and is not intended to be limited. In some implementations, the reference layer 108 has a thickness in a range from about 5 to about 25 nm. In other implementations, the reference layer 108 has a thickness in a range from about 10 to about 15 nm.

The free layer 112 has a thickness that can generally vary and is not intended to be limited. In some implementations, the free layer 112 has a thickness in a range from about 1 to about 5 nm. In other implementations, the free layer 112 has a thickness in a range from about 1 to about 2 nm.

A cap layer 114 can be formed on top of the free layer 112 and a top electrode 116 is formed on top of the cap layer 114. The cap layer 114 can be a hardmask. The material of the cap layer 114 can be, for example, titanium nitride. More or fewer layers can be formed on top of the free layer 112. In some embodiments of the invention, the position of the free layer 112 and the reference layer 108 are reversed, such that the free layer 112 is formed on the bottom electrode 106, as understood by one skilled in the art.

Figure 2:
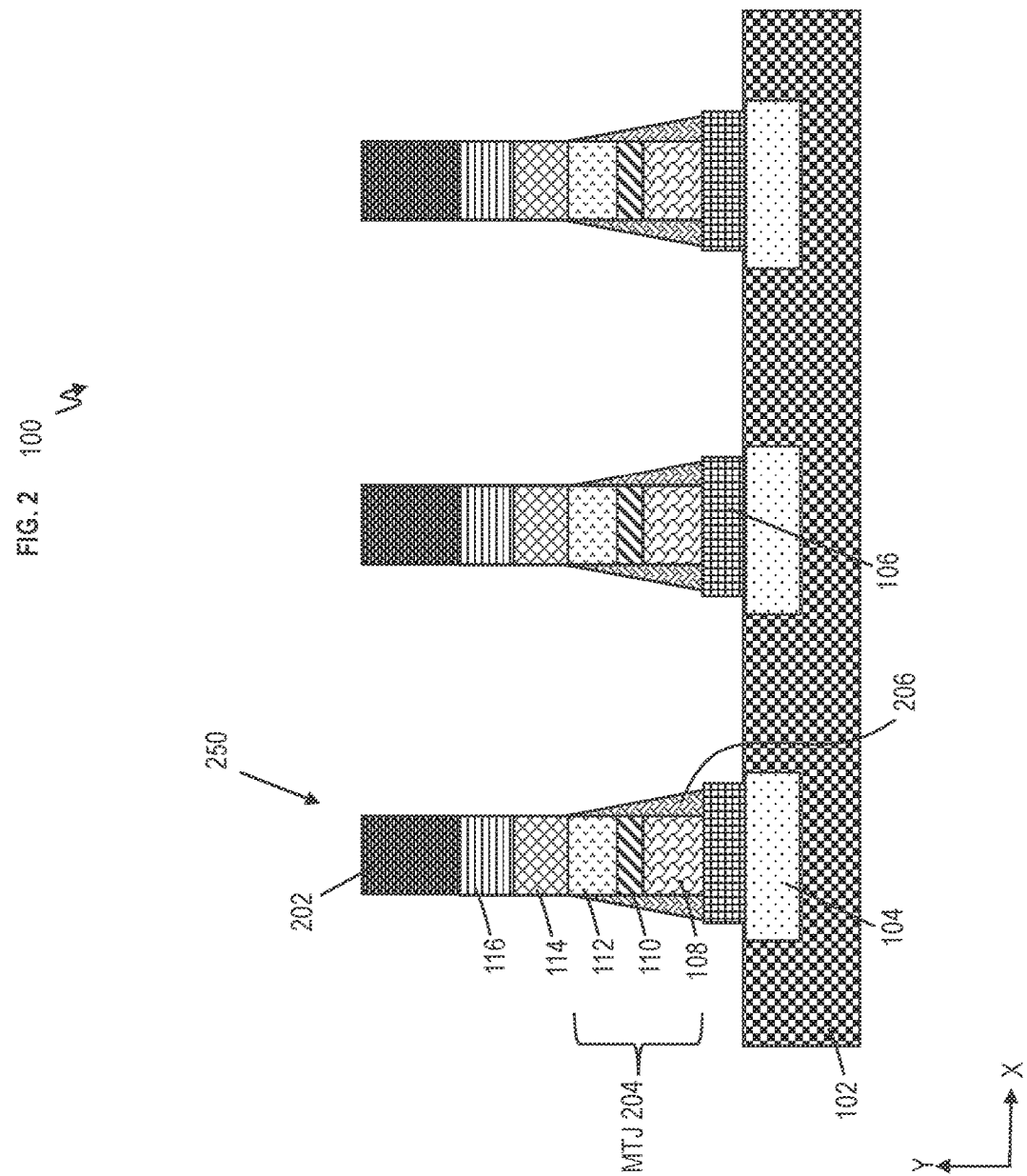
FIG. 2 depicts a cross-sectional view of the magnetic device after a fabrication operation according to embodiments of the invention.

FIG. 2 depicts a cross-sectional view of the magnetic device 100 according to embodiments of the invention. A photoresist material is deposited on top of the top electrode 116, and patterned into the patterned resist 202 using standard lithography. Using the patterned resist 202 as a mask, inert ion beam etching (IBE) is utilized to etch the layers 108, 110, 112, 114, and 116 into stacks 250. Three stacks 250 are illustrated for example purposes but fewer or more stacks can be formed. The inert ion beam etching is typically at an angle of about 5° to 50°, and further etching can be at an angle of about 80° to further trim the device.

The patterned reference layer 108, tunnel barrier layer 110, and free layer 112 form a magnetic tunnel junction (MTJ) 204. During this etching process, metal from etching the reference layer 108 and free layer 112 (and/or any etched layers above the free layer 112) are redeposited on one or more of the reference layer 108, the tunnel barrier 110, and free layer 112 as metal redeposition material 206. The metal redeposition material 206 forms an unwanted short circuit between the reference layer 108 and the free layer 112.

Figure 3:
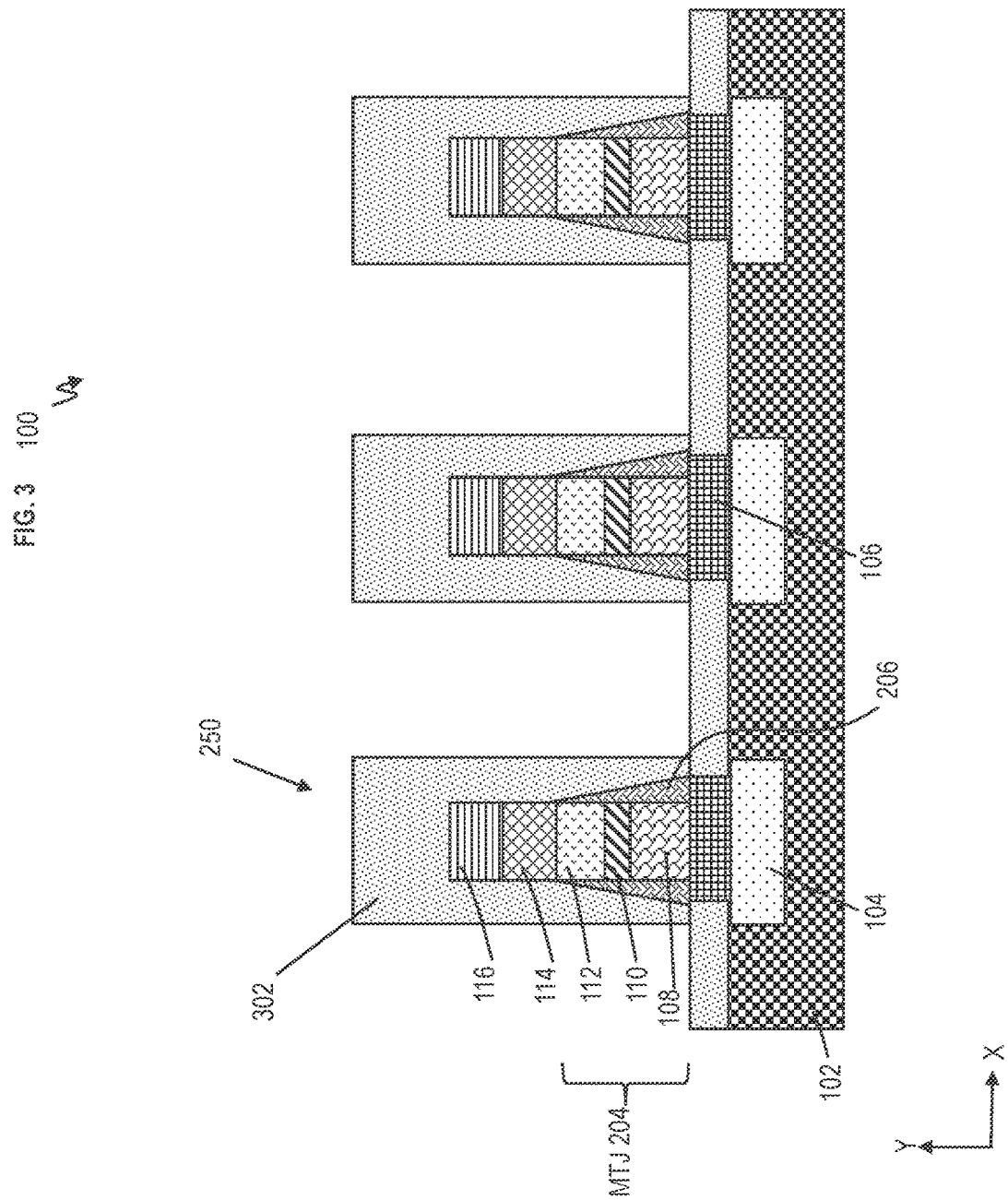
FIG. 3 depicts a cross-sectional view of the magnetic device after a fabrication operation according to embodiments of the invention.

FIG. 3 depicts a cross-sectional view of the magnetic device 100 according to embodiments of the invention. The patterned resist 202 is removed. For example, the patterned resist 202 can be etched by solvent striping, $O_2$ ashing, or $N_2H_2$ plasma which is commonly used to remove photoresist. A (first) protective film 302 is deposited on the stack 250, the metal redeposition material 206, a portion of the bottom electrode 106, and the substrate 102. The protective film 302 can be, for example, silicon nitride. Other examples of the protective film 302 can include dielectric materials and metals as a protective material to cover the MTJ 204.

Figure 4:
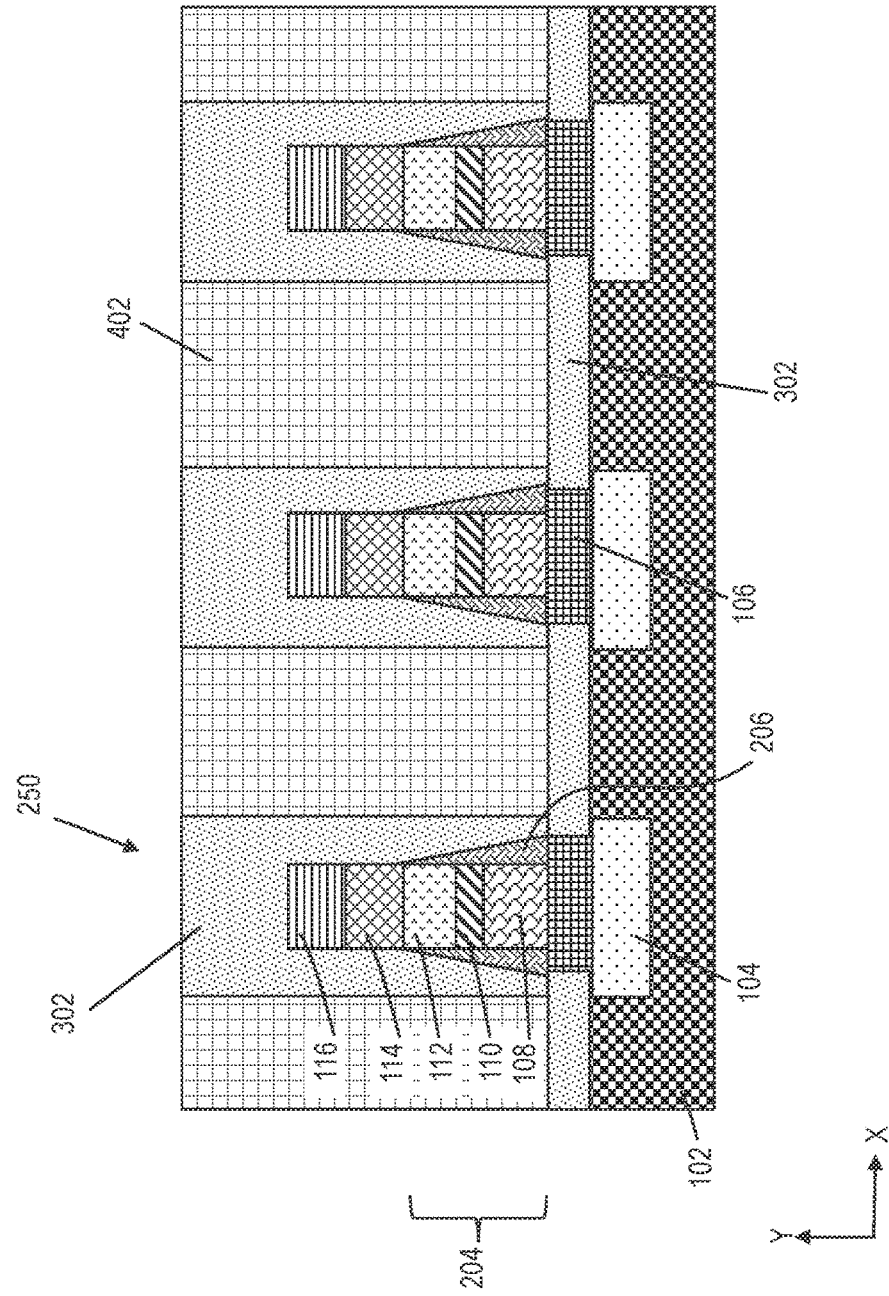
FIG. 4 depicts a cross-sectional view of the magnetic device after a fabrication operation according to embodiments of the invention.

FIG. 4 depicts a cross-sectional view of the magnetic device 100 according to embodiments of the invention. A planarizing material 402 is deposited. The planarizing material 402 can be deposited by standard deposition processes. Chemical mechanical polishing/planarization can be performed to stop on top of the protective film 302, such that the planarizing material 402 and protective film 302 are coplanar. The planarizing material 402 can be, for example, silicon dioxide. Other example materials of the planarizing material 402 can include spin oxide resist, antireflective coating (ARC) material, and other dielectric materials.

Figure 5:
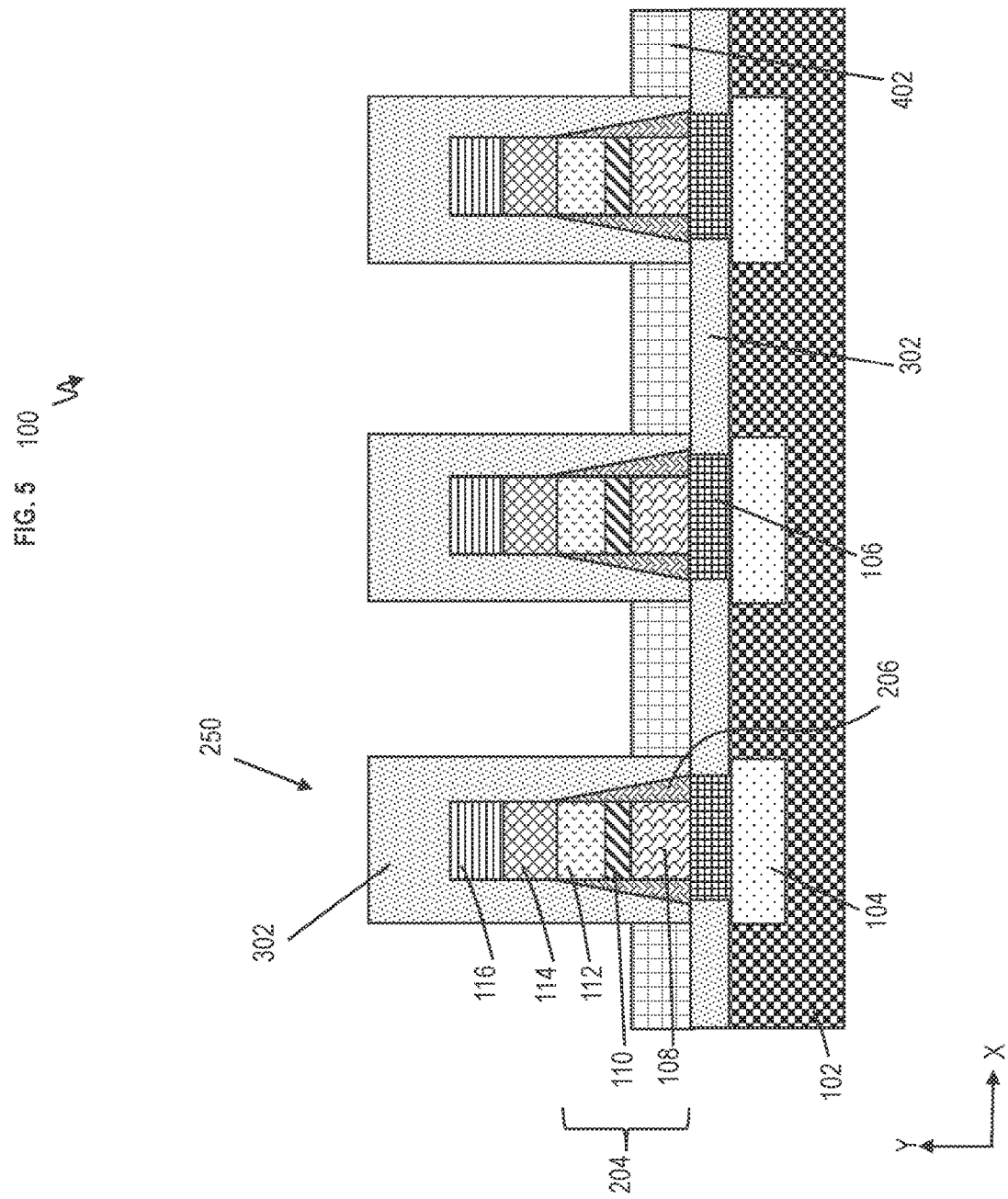
FIG. 5 depicts a cross-sectional view of the magnetic device after a fabrication operation according to embodiments of the invention.

FIG. 5 depicts a cross-sectional view of the magnetic device 100 according to embodiments of the invention. In FIG. 5, the planarizing material 402 is recessed to a desired level by selective etching, which can be a wet or dry etch. For example, a selective oxide etch can be utilized to etch the planarizing material 402 (e.g., silicon dioxide). An example etchant can be a dilute hydrofluoric acid (HF). The planarizing material 402 is recessed to protect the reference layer 108 but to expose the tunnel barrier layer 110. The planarizing material 402 can be recessed to the bottom of the tunnel barrier layer 110, all of which is in preparation for subsequent cleaning.

Figure 6:
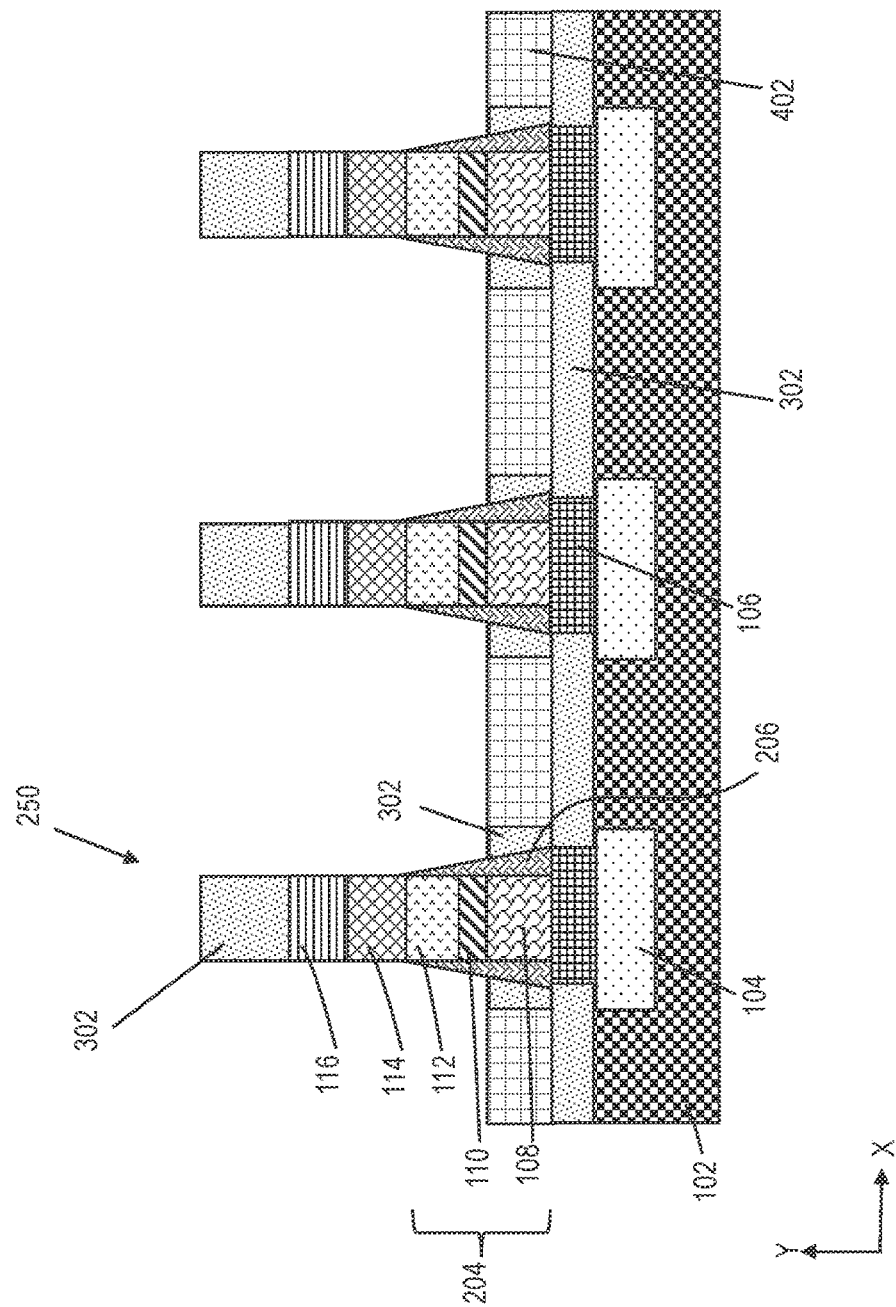
FIG. 6 depicts a cross-sectional view of the magnetic device after a fabrication operation according to embodiments of the invention.

FIG. 6 depicts a cross-sectional view of the magnetic device 100 according to embodiments of the invention. FIG. 6 illustrates that an upper portion of the protective film 302 is removed by IBE, such that a portion of the metal redeposition material 206 is exposed. Although IBE can be a type of etch that is used to remove an upper portion of the protective film 302, it should be appreciated that other types of etching processes can be utilized as understood by one skilled in the art.

The removed upper portion of the protective film 302 stops at the reference layer 108, such that a lower portion of the protective layer 302 remains on the reference layer 108 and the metal redeposition material 206 on the reference layer 108. Removing the upper portion of the protective film 302, leaves all or part of the tunnel barrier layer 110 and free layer 112 exposed. Although FIG. 6 illustrates the protective film 302 reduced to at, near, and/or below a bottom surface of the tunnel barrier layer 110 in the y-axis, there are various options of how much of the tunnel barrier layer 110 is exposed as discussed further herein.

Figure 7:
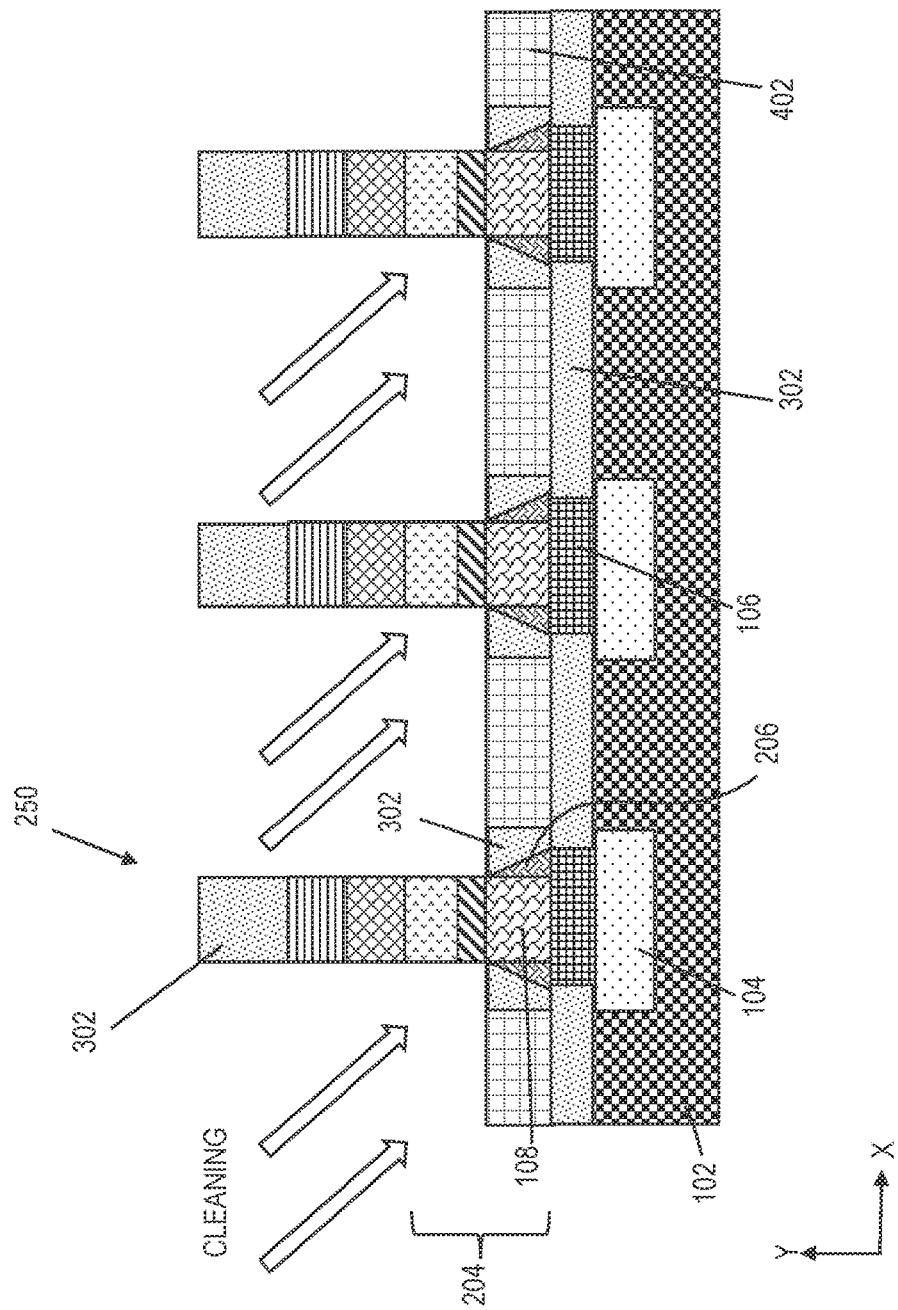
FIG. 7 depicts a cross-sectional view of the magnetic device after a fabrication operation according to embodiments of the invention.

FIG. 7 depicts a cross-sectional view of the magnetic device 100 according to embodiments of the invention. Continuing the inert ion beam etching in FIG. 6, IBE is performed to remove the exposed metal redeposition material 206. The IBE works as a cleaning that removes exposed metal redeposition material 206 from the tunnel barrier 110 and the free layer 112. As one example of the IBE cleaning/etching to remove the metal redeposition material 206, the IBE cleaning can be performed using argon at 200-800 volts with an angle of about 25° to about 80° from the perpendicular surface (e.g., the substrate 102). Accordingly, the tunnel barrier 110 is cleaned of the metal redeposition material 206 thereby removing any short circuit between the reference layer 108 and the free layer 112. Particularly, this metal redeposition material 206 is removed from the tunnel barrier layer 110 without the requirement of oxidizing the redeposited metal to make the redeposited metal insulating, thereby avoiding this oxidation step which can cause device degradation. Although IBE can be a type of etch that is used to remove an upper portion of the protective film 302, it should be appreciated that other types of etching processes can be utilized as understood by one skilled in the art. However, it should be appreciated that one or more embodiments of the invention are directed toward processes that use IBE. The combination of the process flow discussed herein along with the IBE overcomes the issue of metallic residue leading to shorts from across the tunnel barrier. If RIE is used to etch, there is damage formed that can reduce performance of the MTJ.

Figure 8:
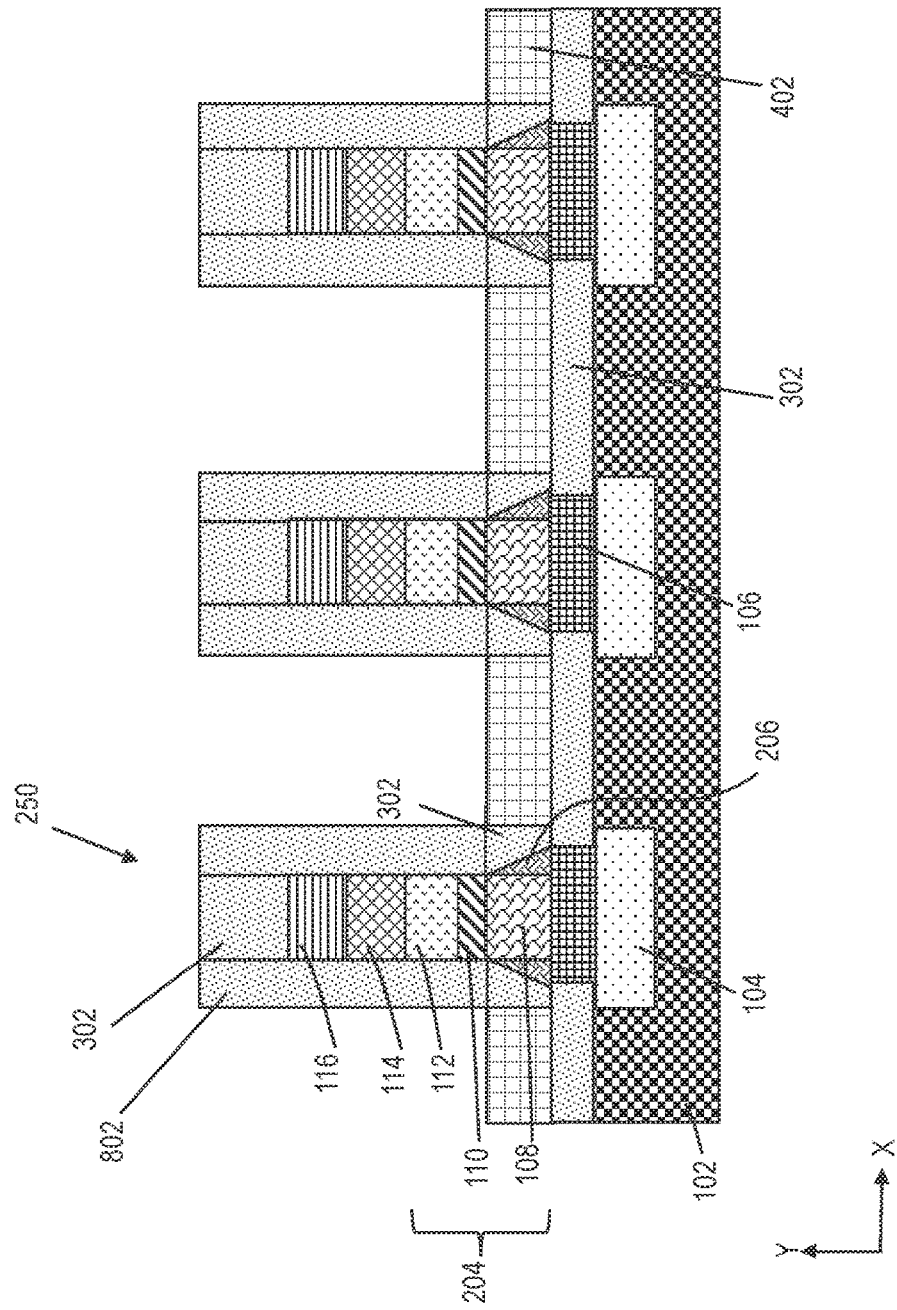
FIG. 8 depicts a cross-sectional view of the magnetic device after a fabrication operation according to embodiments of the invention.

FIG. 8 depicts a cross-sectional view of the magnetic device 100 according to embodiments of the invention. FIG. 8 illustrates that a second protective film 802 is formed back in the location where the upper portion of (first) protective film 302 was removed. The second protective film 802 can be deposited in situ. The second protective film 802 can be the same material as the first protective film 302.

Figure 9:
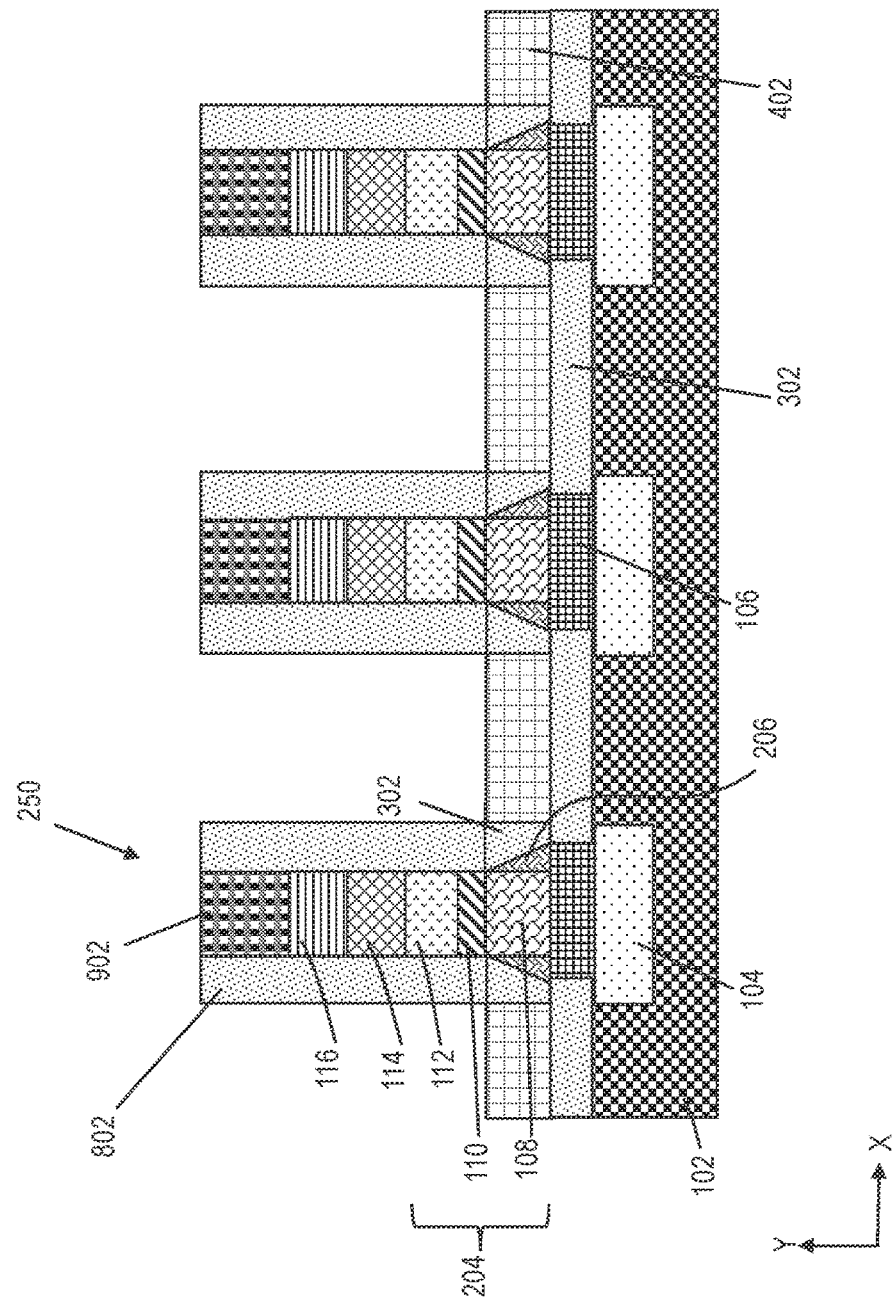
FIG. 9 depicts a cross-sectional view of the magnetic device after a fabrication operation according to embodiments of the invention.

FIG. 9 depicts a cross-sectional view of the magnetic device 100 according to embodiments of the invention. The top of the stack 250 can be opened (i.e., etched) in order to deposit a metal contact 902 on top of the top electrode 116, as understood by one skilled in the art.

Figure 10:
FIG. 10 depicts a flowchart of a method of cleaning a magnetic device according to embodiments of the invention.

FIG. 10 depicts a flowchart 1000 of a method of cleaning a magnetic device 100 according to embodiments of the invention. The method includes forming a stack including a magnetic tunnel junction (MTJ) 204, and the MTJ 204 includes a reference magnetic layer 108 and a free magnetic layer 112 sandwiching a tunnel barrier layer 110 at block 1002. The method includes forming a protective film 302 on a bottom portion of the MTJ 204 such that an upper portion of the MTJ 204 is exposed at block 1004. Also, the method includes cleaning the exposed upper portion of the MTJ 204 such that any residual material (e.g., metal redeposition material 206) is removed at block 1006.

In one or more embodiments of the invention, the tunnel barrier layer 110 is part of the upper portion of the MTJ 204 that is exposed. A portion of the tunnel barrier layer 110 is exposed in the upper portion of the MTJ but not the entirety of the tunnel barrier layer 110. A lower portion of the tunnel barrier layer is covered by the protective film 302. The protective film 302 is below a middle portion of the tunnel barrier layer 110. The protective film 302 reaches to about a middle portion of the tunnel barrier layer 110. The residual material includes metal redeposited (e.g., metal redeposition material 206) from forming the MTJ 204. The cleaning includes inert ion beam etching (IBE). The cleaning removes a short circuit of the MTJ 204 created by the residual material (e.g., metal redeposition material 206). The bottom portion of the MTJ 204 is protected from the cleaning by the protective film 302, such that the residual material (e.g., metal redeposition material 206) remains on the bottom portion.

FIG. 11 depicts a flowchart of a method of forming a magnetic device 100 according to embodiments of the invention. The method includes forming a stack 250 including a magnetic tunnel junction (MTJ) 204, in which the MTJ 204 includes a reference magnetic layer 108 and a free magnetic layer 112 sandwiching a tunnel barrier layer 110 at block 1102. The method includes forming a protective film 302 on a bottom portion of the MTJ 204 such that an upper portion of the MTJ 204 is exposed at block 1104. The method includes cleaning the upper portion of the MTJ 204 that is exposed such that any residual material (e.g., metal redeposition material 206) is removed at block 1106 and forming a contact 902 on the MTJ 204 at block 1108.

In one or more embodiments of the invention, the method includes forming another protective film 802 on the upper portion of the MTJ 204 in the stack 250. The method includes forming a cap layer 114 (or hardmask) on the MTJ 204. The method includes forming a top electrode 116 on the MTJ 204. The MTJ 204 is formed on a bottom electrode 106. The tunnel barrier layer 110 is part of the upper portion of the MTJ 204 that is exposed. A portion of the tunnel barrier layer 110 is exposed in the upper portion of the MTJ. A lower portion of the tunnel barrier layer 110 is covered by the protective film 302.

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of cleaning a magnetic device, the method comprising:
    forming a stack including a magnetic tunnel junction (MTJ), the MTJ including a reference magnetic layer and a free magnetic layer sandwiching a tunnel barrier layer;
    forming a protective film on a bottom portion of the MTJ such that an upper portion of the MTJ is exposed, wherein a planarizing material is adjacent to the protective film, the planarizing material also being formed on the bottom portion of the MTJ such that the upper portion of the MTJ is exposed; and
    cleaning the upper portion of the MTJ that is exposed such that any residual material is removed.

2. The method of claim 1, wherein the tunnel barrier layer is part of the upper portion of the MTJ that is exposed.

3. The method of claim 1, wherein a portion of the tunnel barrier layer is exposed in the upper portion of the MTJ.

4. The method of claim 1, wherein a lower portion of the tunnel barrier layer is covered by the protective film.

5. The method of claim 1, wherein the protective film is below a middle portion of the tunnel barrier layer.

6. The method of claim 1, wherein the protective film reaches to about a middle portion of the tunnel barrier layer.

7. The method of claim 1, wherein the residual material comprises metal redeposited from forming the MTJ.

8. The method of claim 1, wherein the cleaning comprises inert ion beam etching (IBE).

9. The method of claim 1, wherein the cleaning removes a short circuit of the MTJ created by the residual material.

10. The method of claim 1, wherein the bottom portion of the MTJ is protected from the cleaning by the protective film, such that the residual material remains on the bottom portion.

11. A method of forming a magnetic device, the method comprising:
forming a stack including a magnetic tunnel junction (MTJ), the MTJ including a reference magnetic layer and a free magnetic layer sandwiching a tunnel barrier layer;
forming a protective film on a bottom portion of the MTJ such that an upper portion of the MTJ is exposed, wherein a planarizing material is adjacent to the protective film, the planarizing material also being formed on the bottom portion of the MTJ such that the upper portion of the MTJ is exposed;
cleaning the upper portion of the MTJ that is exposed such that any residual material is removed; and
forming a contact on the MTJ.

12. The method of claim 11 further comprising forming another protective film on the upper portion of the MTJ.

13. The method of claim 11 further comprising forming a cap layer on the MTJ.

14. The method of claim 11 further comprising forming a top electrode on the MTJ.

15. The method of claim 11, wherein the MTJ is formed on a bottom electrode.

16. The method of claim 11, wherein the tunnel barrier layer is part of the upper portion of the MTJ that is exposed.

17. The method of claim 11, wherein a portion of the tunnel barrier layer is exposed in the upper portion of the MTJ.

18. The method of claim 11, wherein a lower portion of the tunnel barrier layer is covered by the protective film.

19. A magnetic device comprising:
a stack including a magnetic tunnel junction (MTJ), the MTJ including a reference magnetic layer and a free magnetic layer sandwiching a tunnel barrier layer;
a protective film formed on a bottom portion of the MTJ such that an upper portion of the MTJ is exposed; and
another protective film formed in direct contact with the upper portion of the MTJ.

20. The magnetic device of claim 19, wherein the tunnel barrier layer is part of the upper portion of the MTJ.

21. The magnetic device of claim 19, wherein a lower portion of the tunnel barrier layer is covered by the protective film.

22. The magnetic device of claim 19, wherein the protective film is below a middle portion of the tunnel barrier layer.

23. The magnetic device of claim 19, wherein the protective film reaches to about a middle portion of the tunnel barrier layer.

24. A method of cleaning a magnetic device, the method comprising:
forming a magnetic tunnel junction (MTJ);
forming a protective film on a portion of the MTJ such that another portion of the MTJ is exposed, wherein a planarizing material is adjacent to the protective film, the planarizing material also being formed on the portion of the MTJ such that the another portion of the MTJ is exposed; and
cleaning the another portion of the MTJ that is exposed.

25. A magnetic device comprising:
a magnetic tunnel junction (MTJ); and
a protective film formed on a portion of the MTJ such that another portion of the MTJ is exposed, wherein one or more parts of the portion of the MTJ has redeposited material while the another portion is free of the redeposited material, wherein a planarizing material is adjacent to the protective film, the planarizing material also being formed on the portion of the MTJ such that the another portion of the MTJ is exposed.

* * * * *